(12) United States Patent
Liu (10) Patent No.: US 6,476,729 B1
(45) Date of Patent: Nov. 5, 2002

(54) POWER MONITORING MODULE WITH DISPLAY UNIT FOR ELECTRICAL POWER SOURCE DEVICE

(76) Inventor: Daniel Liu, 4F, No. 10, Alley 59, Lane 42, Min Chuan Road, Hsin Tien, Taipei Hsien (TW)

( * ) Notice: Subject to any disclaimer, the term of this patent is extended or adjusted under 35 U.S.C. 154(b) by 135 days.

(21) Appl. No.: 09/642,839

(22) Filed: Aug. 22, 2000

(51) Int. Cl.[7] .............................................. G08C 19/04
(52) U.S. Cl. ............................ 340/870.11; 340/310.08; 340/870.02
(58) Field of Search ....................... 340/870.11, 310.08, 340/656, 870.02

(56) References Cited

U.S. PATENT DOCUMENTS 5,650,771 A * 7/1997 Lee ........................ 340/310.08

* cited by examiner

Primary Examiner—Timothy Edwards, Jr.
(74) Attorney, Agent, or Firm—Rosenberg, Klein & Lee (57) ABSTRACT

A power monitoring module with a display unit configured to be mounted on an electrical power source device, such as uninterrupted power supply or a power strip, for indicating a plurality of electrical parameters is disclosed. The power monitoring module includes a casing provided with a central open area and a plurality of through holes thereon, and a printed circuit board are mounted to the casing. A control circuit is arranged on the printed circuit board and electrically coupled to the power source device for detecting the electrical parameters of the electric appliance plugged on the power source device. A plurality of operation keys are arranged on the printed circuit board, corresponding to the through holes formed on the casing. A display unit arranged on the printed circuit board, corresponding to the central open area of the casing for displaying at least one of the plurality of electrical parameters detected by the control circuit.

2 Claims, 10 Drawing Sheets

POWER MONITORING MODULE WITH DISPLAY UNIT FOR ELECTRICAL POWER SOURCE DEVICE

BACKGROUND OF THE INVENTION

1. Field of the Invention

The present invention relates to a power monitoring module for a power source device, and more particularly to an electrical power monitoring module with a display unit capable of displaying various, electrical parameters of an electric appliance plugged on the power source device.

2. Description of the Prior Art

The conventional extension type electrical socket device, known as power strip, with a pair of extension wires is a typical type of electrical power source device. The socket device is generally provided with a plurality of sockets thereon, so that at least one electric appliance may plug in the socket. Some of the power strip is further equipped with a power on/off switch for switching on or off the electric power to the sockets. Another power strip is further equipped with a fuse serving as an over current protective element. None of the conventional power strip is equipped with a display unit for displaying various electrical parameters of the operating status of the electric appliance plugged on the power strip.

Further, the well-known un-interrupted power supply, abbreviated UPS, is the other type of electrical power source device. Most of the UPS is simply designed as a backup power supply for such as computer device when the regular electrical power supply fails. It is difficult for ordinary users to measure the electrical parameters such as kilowatt-hour, power factor, watt, etc. of the electric appliances or the power source, Thus, it is desirable to provide an improved power source device with a display unit which is capable of indicting various electrical parameters of both the electric appliance electrically connected to the power source device and the power source.

SUMMARY OF THE INVENTION

Consequently, it is a primary object of the present invention to provide a power monitoring module for an electrical power source device, such as an electrical power strip or an un-interrupted power supply. The power monitoring module is capable of detecting various electrical parameters of the electric appliances plugged on the power source device.

The other object of the present invention is to provide a power monitoring module with a display unit capable of displaying relevant electrical parameters of the power source device and the electric appliances plugged on the power source device. The electrical parameters include voltage value, current value, watt, kilowatt-hour, apparent power value, power factor, frequency, and so on.

The present invention can be best understood through the following description and accompanying drawings, wherein:

DETAILED DESCRIPTION OF THE PREFERRED EMBODIMENTS

First Embodiment

Figure 1:
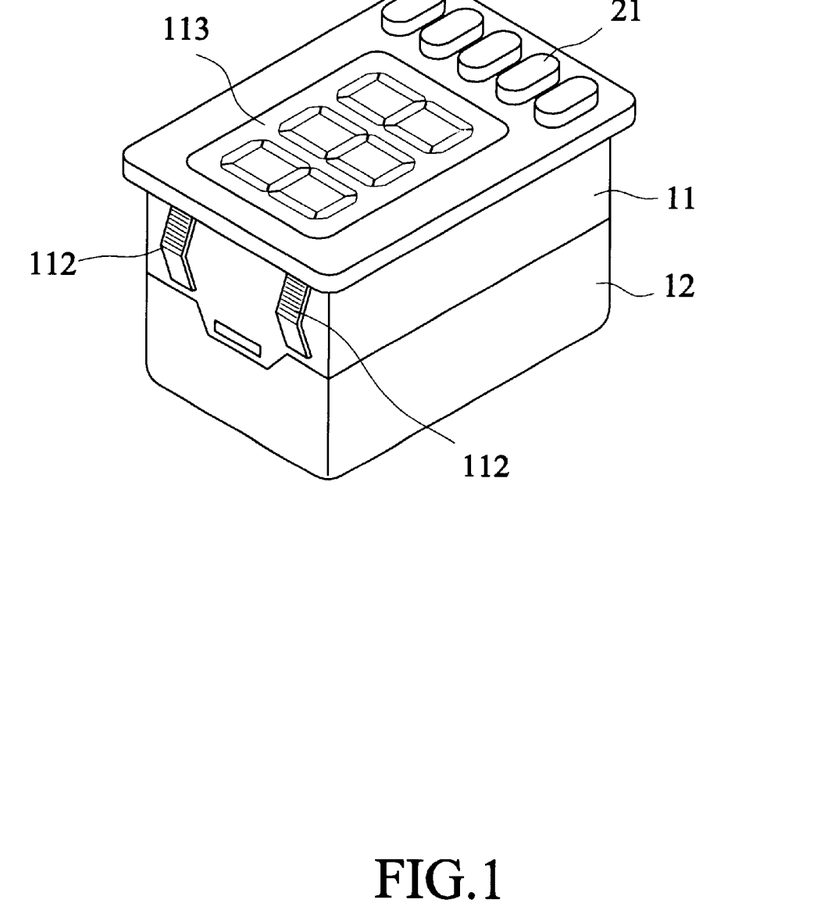
FIG. 1 is a perspective view of the power monitoring module in accordance with a first embodiment of the present invention.
Figure 2:
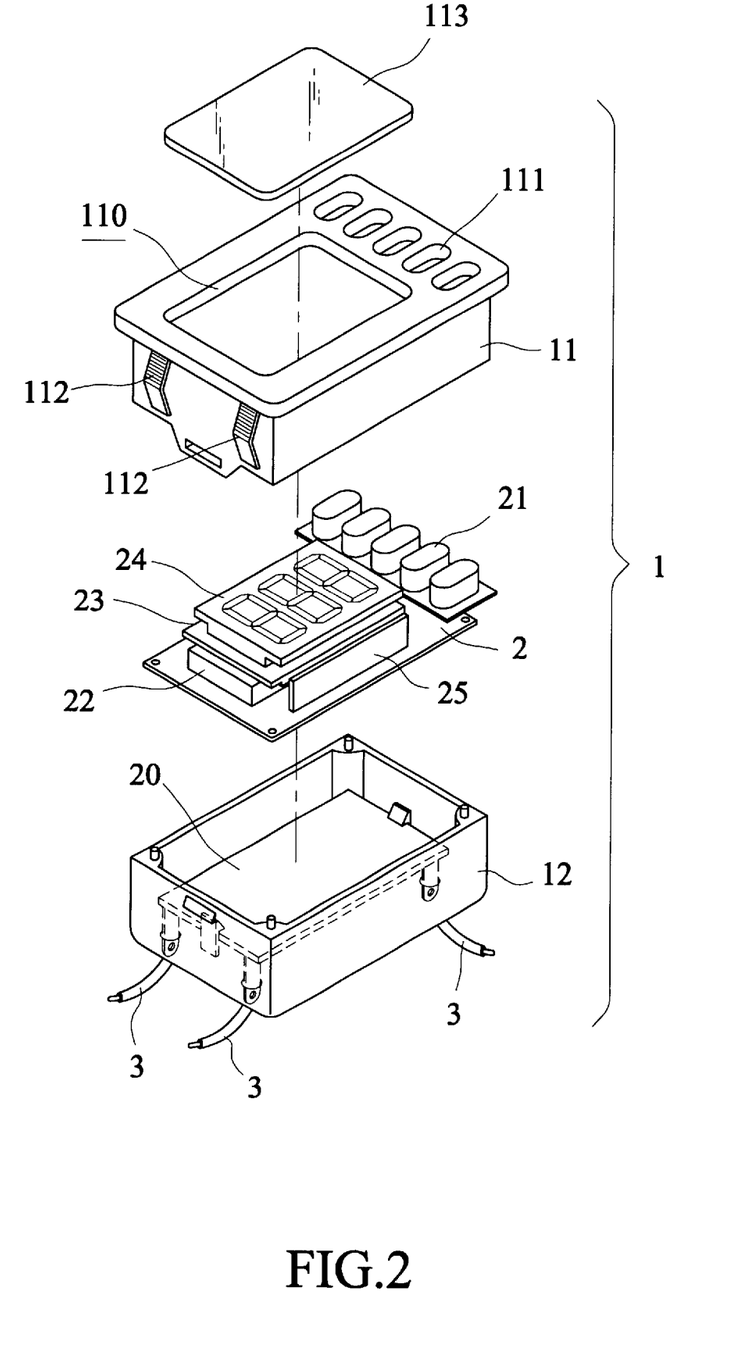
FIG. 2 is an exploded view of the power monitoring module of FIG. 1.

With reference to FIG. 1, it is a perspective view of the power monitoring module 1 in accordance with a first embodiment of the present invention. FIG. 2 is an exploded view of the power monitoring module 1 of FIG. 1. The power monitoring module 1 includes a casing composed of an upper casing 11 and a lower casing 12. An inner space is formed between the upper casing 11 and the lower casing 12. A number of through holes 111 are formed on the top surface of the upper casing 11. A pair of outward locking members 112 are formed on opposite side walls of the upper casing 11. A central transparent plate 113 may be mounted on a central open area 110 formed on the top surface of the upper casing 11.

A first printed circuit board 2 is located within the inner space formed between the upper casing 11 and the lower casing 12. A control circuit is arranged on the printed circuit board 2 for measuring, calculating, and processing various electrical parameters of a power source device. In this embodiment, a second printed circuit board 20 is further retained in the inner space between the upper casing 11 and the lower casing 12. A number of electrical wires 3 are extended from the second printed circuit board 20, used to electrically connect to the power source device to be measured and monitored.

A number of operating keys 21 are arranged on the first printed circuit board 2, corresponding to the through holes 111 of the upper casing 11. Preferably, the top surface of each operation key 21 is protrusive to the through hole 111 of the upper casing 11.

A display unit is mounted on the first printed circuit board 2, corresponding to the central open area 110 of the upper casing 11. The display unit includes an insulated layer 22, a light emitting device 23, a LCD or LED indicating unit 24, and a conductive cable 25, capable of displaying various electrical parameters of the power source device. As shown in FIG. 2, the insulated layer 22 is positioned on the printed circuit board 2. The indicating unit 24 is capable of indicating the plurality of electrical parameters of the electric appliance in a digital form. The light emitting device 23 is mounted on the insulated layer and electrically connected to the control circuit arranged on the printed circuit board via the cable 25 for generating a lighting source to the indicating unit 24.

Figure 3:
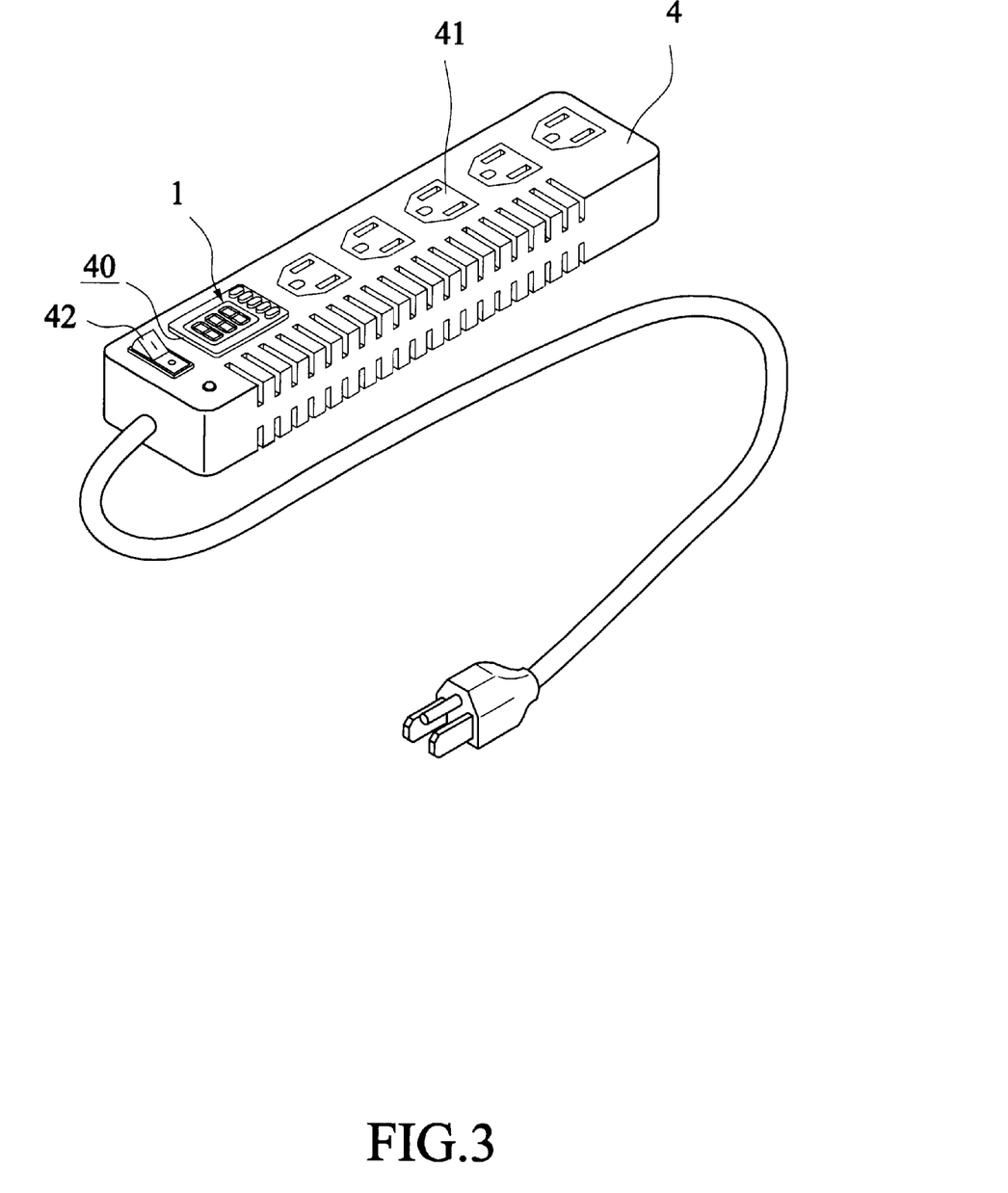
FIG. 3 is a perspective view showing that a power monitoring module of the first embodiment of the present invention is mounted on a power strip with an extension wire.

The power monitoring module of this embodiment is suitable to be mounted in a power strip 4 which includes a number of sockets thereon and an extension wire which may be plugged in an electrical socket, as shown in FIG. 3. In this application, the power monitoring module 1 is mounted on an open area 40 of the power strip 4. The power strip 4 is typically provided with plural sockets 41 thereon and a power on/off switch 42.

Figure 4:
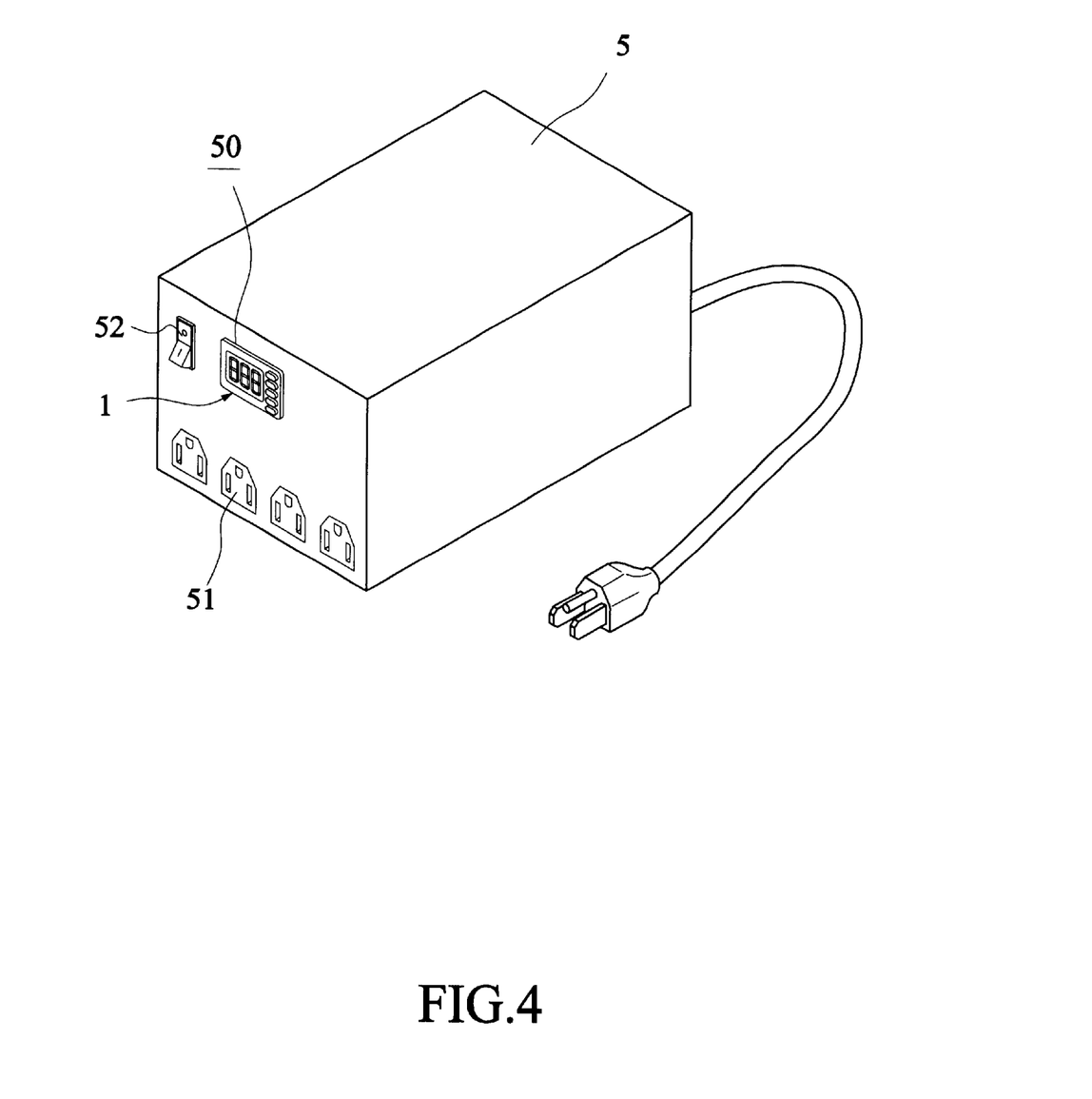
FIG. 4 is a perspective view showing that a power monitoring module of the first embodiment of the present invention is mounted on an uninterrupted power source.

The power monitoring module 1 of the present invention is also suitable to be mounted on an open area 50 formed on a front panel of an un-interrupted power supply 5, as shown in FIG. 4. The uninterrupted power supply 5 is also typically provided with plural sockets 51 thereon and a power on/off switch 52 on the front panel thereof.

Second Embodiment

Figure 5:
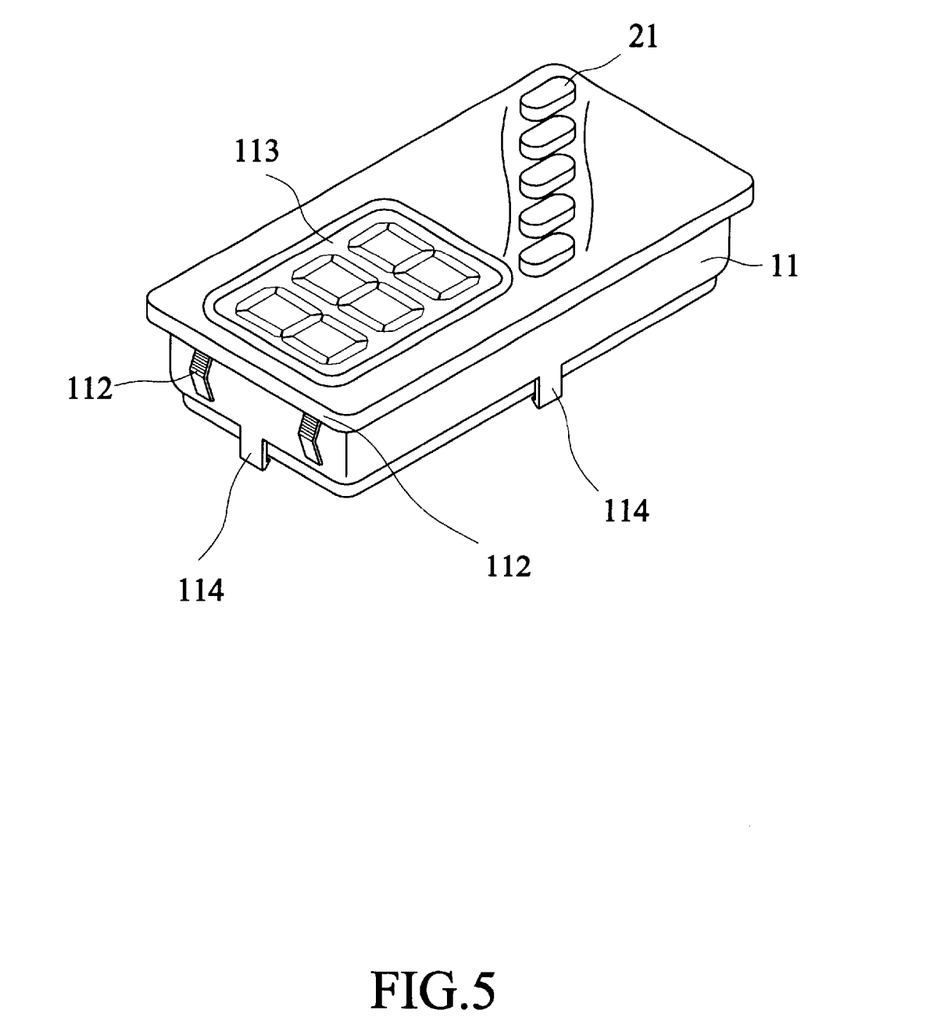
FIG. 5 is a perspective view of the power monitoring module in accordance with a second embodiment of the present invention.
Figure 6:
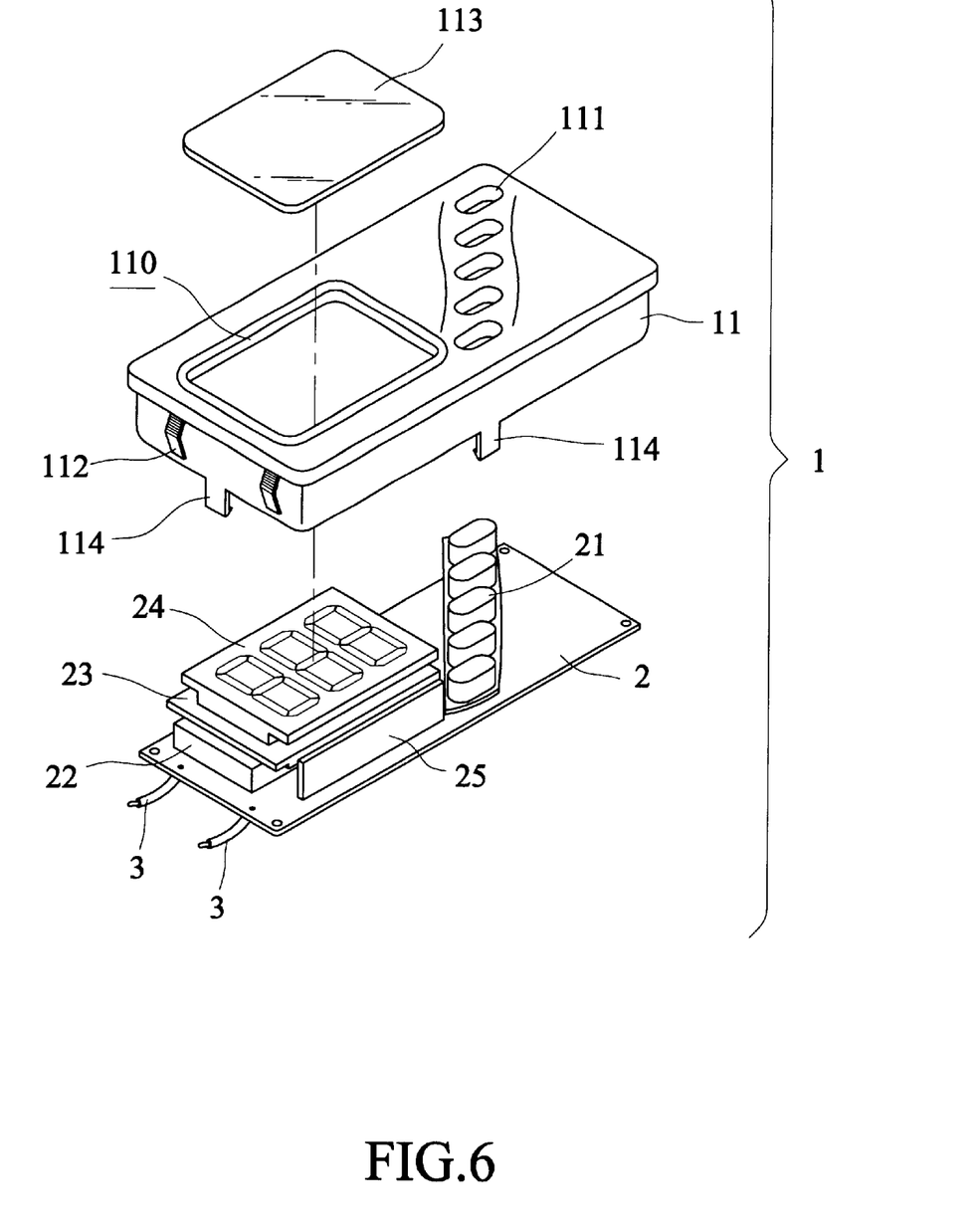
FIG. 6 is an exploded view of the power monitoring module of FIG. 5.

FIG. 5 is a perspective view of the power monitoring module in accordance with a second embodiment of the present invention. FIG. 6 is an exploded view of the power monitoring module of FIG. 5. Most of the elements of this embodiment are similar to that of the first embodiment described above. Wherever possible, the same reference numbers will be used throughout the drawings to refer to the same or like parts. The differences between the first and second embodiment are that the casing of the second embodiment is simply composed of an upper casing 11, and the upper casing 11 is additionally provided with a pair of downward hooking member 114, so that the printed circuit board may be mounted onto the upper casing 11 by means of the hooking members 114.

The hooking member 114 may be replaced by any other suitable fastening elements. As shown in the drawing, the extended conductive wires 3 is directly welded on the printed circuit board 2. In alternative, the extended conductive wires 3 may be replaced with conductive pins, not shown.

Third Embodiment

Figure 7:
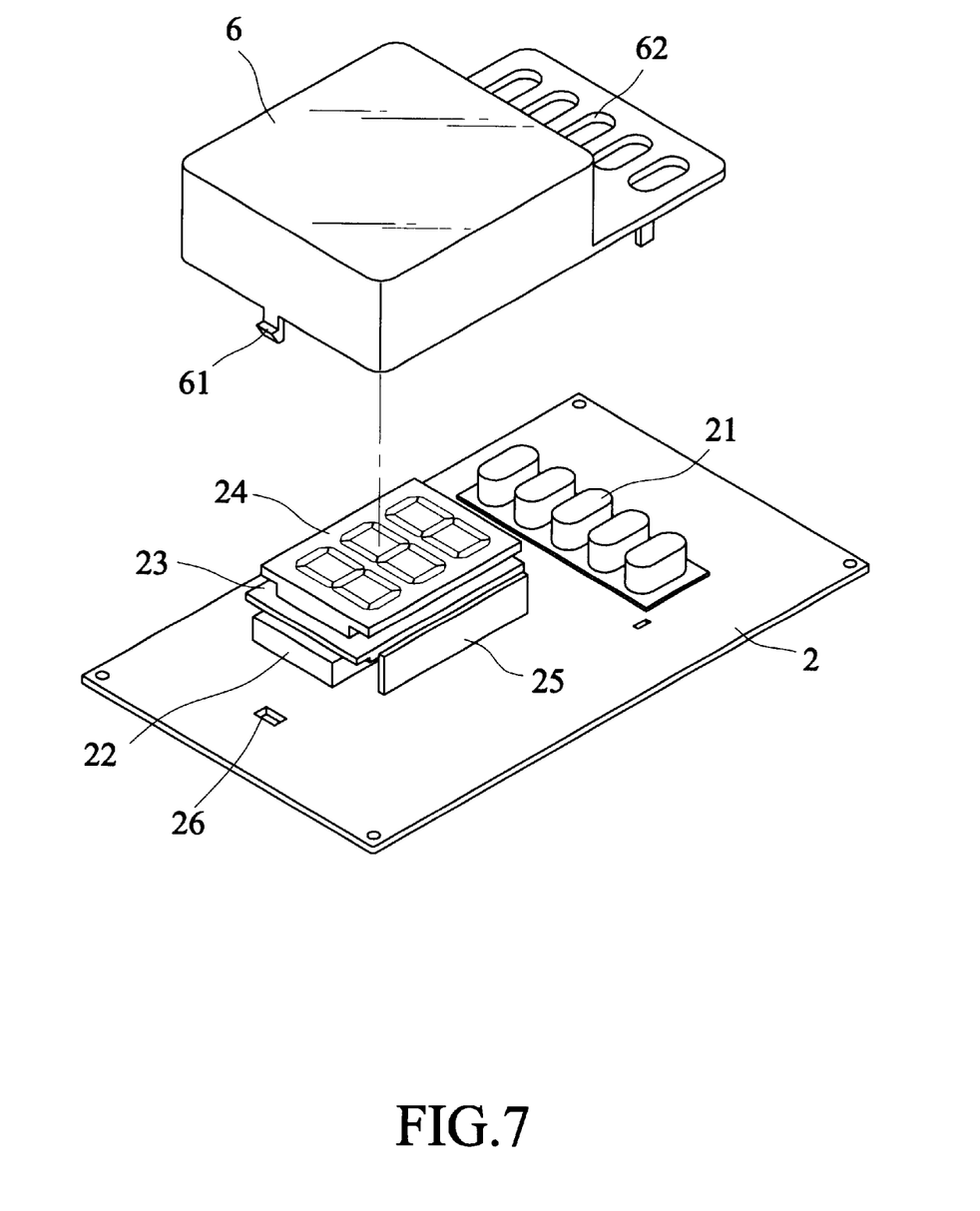
FIG. 7 is an exploded view of the power monitoring module in accordance with a third embodiment of the present invention.

FIG. 7 is an exploded view of the power monitoring module in accordance with a third embodiment of the present invention. Similar to the first and second embodiments described above, the display unit also includes an insulated layer 22, a light emitting device 23, a LCD or LED indicating unit 24, and a conductive cable 25, capable of displaying various electrical parameters of the power source device.

The casing of this embodiment is in a form of cover 6 provided with a pair of hooking members 61 on opposite side walls thereof, so that the cover 6 may be mounted on the printed circuit board 2 by inserting the hooking members 61 into the locking hole 26 of the printed circuit board 2. The cover 6 is formed with a number of through holes 62 thereon, so that the operation keys 21 arranged on the printed circuit board 2 are protrusive to the through holes 62 for operation. The cover 6 is preferably made by transparent material.

Figure 8:
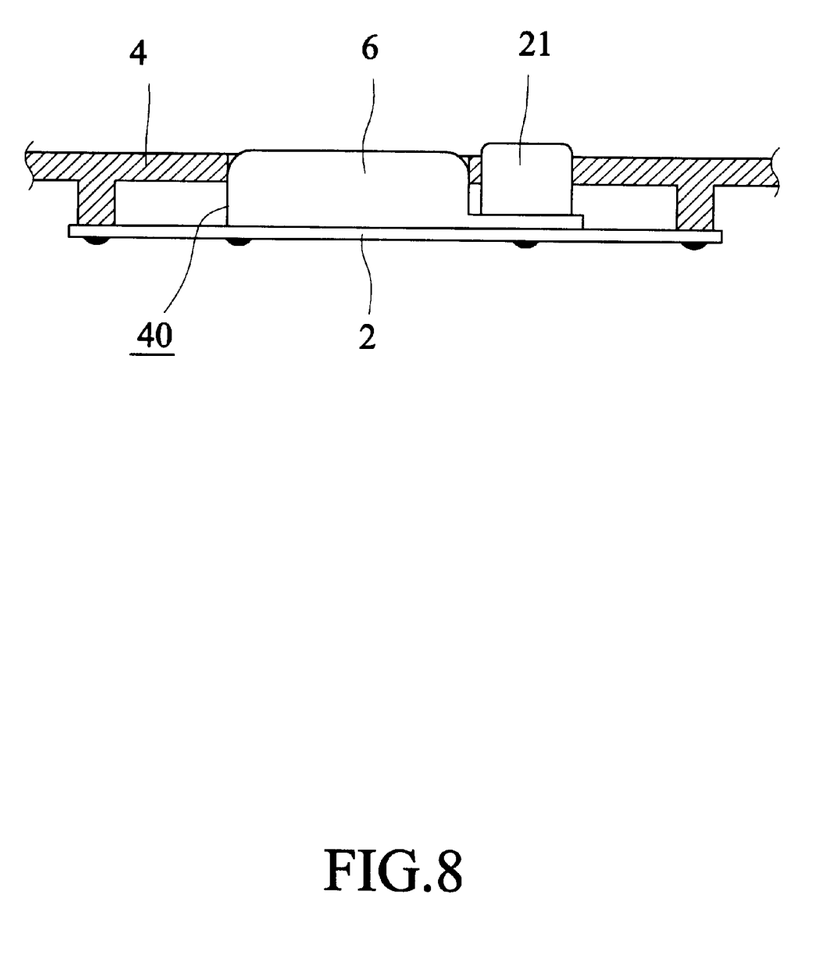
FIG. 8 is an exploded view showing the power monitoring module of FIG. 7 is mounted on a power source device.

In this embodiment, when the cover 6 is mounted on an open area 40 of a power source device 4, the top surface of the cover 6 may be coplanar with the front panel of the power source device 4, as shown in FIG. 8.

Figure 9:
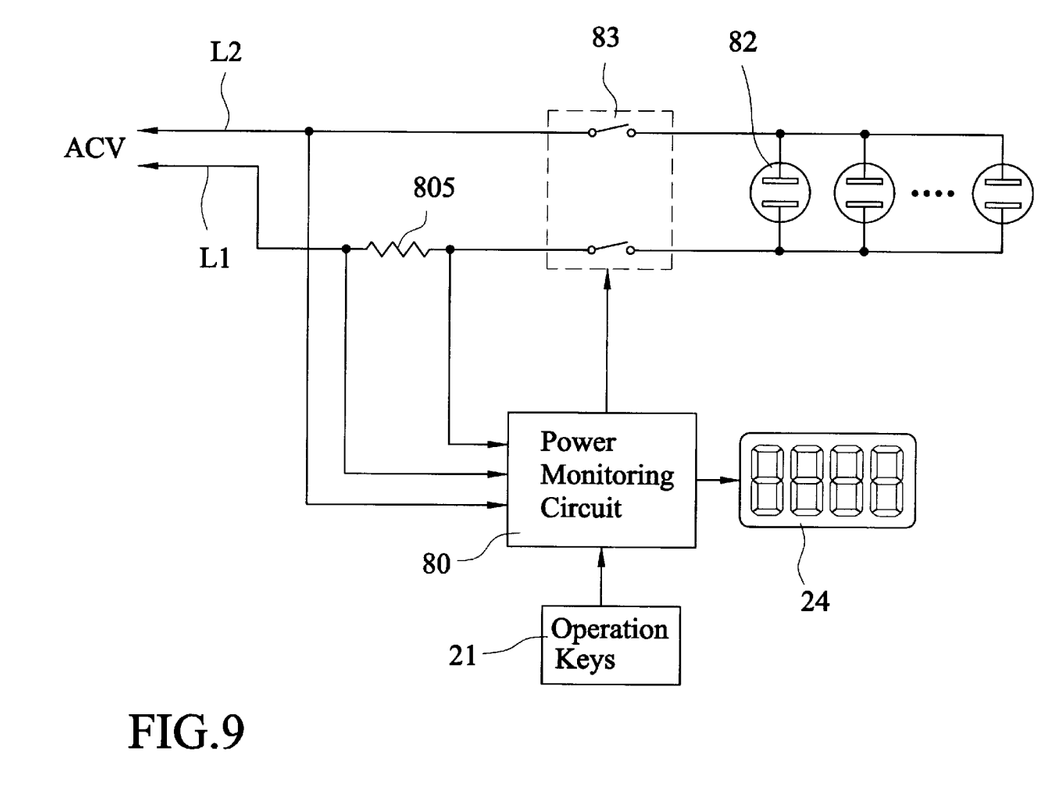
FIG. 9 is a functional block diagram of the power monitoring module of the present invention.

FIG. 9 is a functional block diagram of the present invention, which mainly includes a power monitoring circuit 80 and a display unit 24. The power monitoring circuit 80 is electrically connected to the first power line L1 and the second power line L2 of the AC power source ACV for monitoring various electrical parameters of the electric appliances plugged on the sockets 82.

The control circuit of the present invention further includes a number of operation keys 21 and an over current isolation switch 83. The over current isolation switch 83 is connected to the power lines L1 and L2 in series. The over current isolation switch 83 is capable of cutting off the current passing through the electric appliance plugged on the socket 82 in case that an over current is detected by the power monitoring circuit 80.

Figure 10:
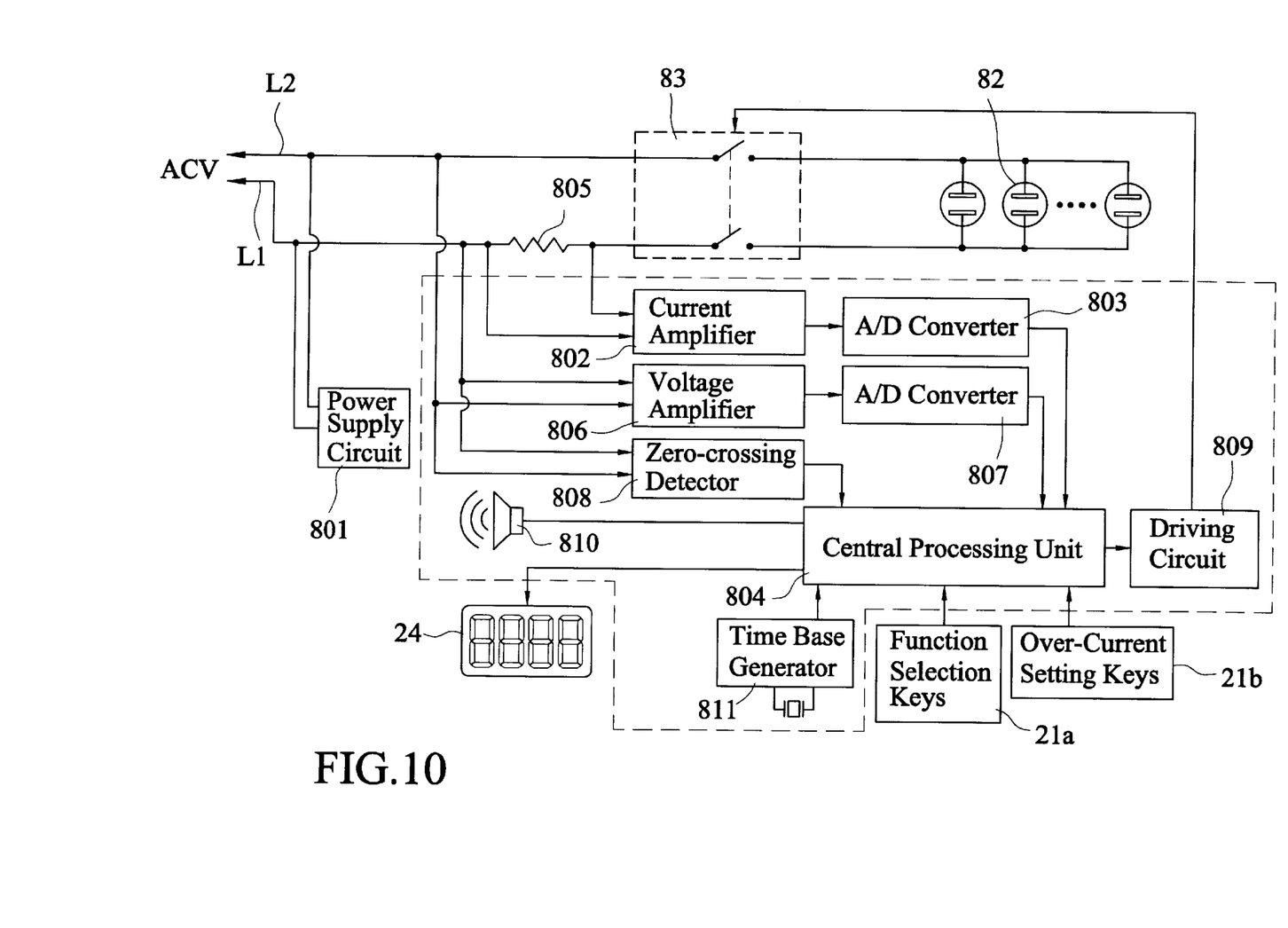
FIG. 10 is a control circuit diagram of the power monitoring module of the present invention.

FIG. 10 is a control circuit diagram of the power monitoring module of the present invention. A power supplying circuit 801 is connected across the power lines L1 and L2, used to convert the AC power source ACV into a DC power source as a working power source for the control circuit of the present invention.

A current amplifier 802 is capable of detecting the value of the current passing through the electric appliance plugged on the socket 82. The current value may be obtained in such a manner that a resistor 805 is serially connected with one of the power lines such as the first power lines L1, and two input ends of the current amplifier 802 are electrically connected across the resistor 805 in parallel. An analog-to-digital converter 803 is used to convert the analog current value generated by the current amplifier 802 into digital current signal which will be sent to a central processing unit 804.

A voltage amplifier 806 has two input ends connected across the power lines L1 and L2 for detecting the voltage value supplied to the electric appliance plugged on the socket 82. An analog-to-digital converter 807 is used for converting the analog voltage value generated by the voltage amplifier 806 into digital voltage signal which will be sent to the central processing unit 804. A voltage zero-crossing detecting circuit 808 is capable of detecting the zero-crossing point of the power source supplied ACV. Each time the value of the alternating current voltage is zero, the zero-crossing detecting circuit 808 will send an output pulse signal at its output end to the central processing unit 804.

A time base signal generator 811 is used to generate a series of time base signals which are sent to the central processing unit 804 as a basis clock signal for time calculation and display.

The operation keys of the present invention include a number of function selection keys 21a for selection of different functions, such as display mode selection. The present invention further includes over current setting keys 21b, so that the user may set a predetermined over current value to actuate the over current isolation switch 83 to cut off the current passing through the socket 82 under control of the central processing unit 804. That is, when a predetermined over current value is detected, the central processing unit 804 will generate a control signal via a driving circuit 809 to actuate the over current isolation switch 83 to cut off the current passing though the electric appliance plugged on the socket 82. Preferably, an alarm 810 may generate an audio signal under control of the central processing unit 804 when the over current value is detected, The central processing unit 804 is capable of receiving the signals generated by the analog-to-digital converters 803, 804, and the zero-crossing detecting circuit 808, and then calculating and processing the signals. The signals will be further converted into desired electrical parameters. Finally, the electrical parameters may be displayed on the LCD or LED indicating unit 24. The electrical parameters indicated on the indicating unit 24 may include voltage value, current value, watt, kilowatt-hour, apparent power value, power factor, frequency, and so on. A part of these data may be directly displayed by the display unit under control of the central processing unit (such as voltage value and current value), while the other of the data are obtained by calculation of the central processing unit according to conventional formulas on the basis of the basic data (such as watt, kilowatt-hour, apparent power value, power factor, etc.).

By means of the power monitoring module incorporating with a power source device such as an extension type electrical socket or an un-interrupted power supply, the present invention may monitoring the operating status of the power source device and indicating a plurality of electrical parameters on an display unit.

It should be noted that the above description and accompanying drawings are only used to illustrate one embodiment of the present invention, not intended to limit the scope thereof. Any modification of the embodiment should fall within the scope of the present invention.

I claim:

1. A power monitoring module mounted on an electrical power source device having at least one electrical socket coupled to a pair of power lines, said power monitoring module comprising:

a housing adapted for mounting in an opening formed in the electrical power source device;

at least one printed circuit board disposed in said housing;

a control circuit mounted on said at least one printed circuit board coupled to the pair of power lines, said control circuit including a processor for detecting a plurality of electrical parameters associated with a device plugged into the at least one electrical socket and an isolation switch having a control input coupled to an output of said processor, said isolation switch being coupled between the at least one electrical socket and the pair of power lines for cutting off current flow to the at least one electrical socket responsive to detection of a predetermined overload limit of one of said plurality of electrical parameters detected by said processor;

a plurality of operation keys mounted on said at least one printed circuit board and coupled to said processor, at least one of said plurality of operation keys being an overload limit setting key for setting said predetermined overload limit of one of said plurality of electrical parameters; and, a display unit mounted on said at least one printed circuit board and mounted to be visible through an opening formed through said housing for displaying at least one of said plurality of electrical parameters detected by said processor.

2. The power monitoring module as recited in claim 1, further comprising a second printed circuit board disposed in said housing and coupled to said at least one printed circuit board, said second printed circuit board providing coupling to the pair of power lines and the at least one electrical socket.

* * * * *